(12) United States Patent
Cheng et al.

(10) Patent No.: US 10,522,721 B2
(45) Date of Patent: Dec. 31, 2019

(54) LIGHT-EMITTING DEVICE AND MANUFACTURING METHOD THEREOF

(71) Applicant: EPISTAR CORPORATION, Hsinchu (TW)

(72) Inventors: Ching-Tai Cheng, Hsinchu (TW); Chun-Hua Shih, Hsinchu (TW); Yih-Hua Renn, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/047,734

(22) Filed: Jul. 27, 2018

(65) Prior Publication Data

US 2018/0337313 A1    Nov. 22, 2018

Related U.S. Application Data

(63) Continuation of application No. 15/395,917, filed on Dec. 30, 2016, now Pat. No. 10,062,816.

(30) Foreign Application Priority Data

Dec. 30, 2015   (TW) .............................. 104144374 A

(51) Int. Cl.
*H01L 33/50* (2010.01)
*H01L 33/48* (2010.01)
*H01L 33/60* (2010.01)
*H01L 33/62* (2010.01)

(52) U.S. Cl.
CPC .......... *H01L 33/508* (2013.01); *H01L 33/483* (2013.01); *H01L 33/505* (2013.01); *H01L 33/60* (2013.01); *H01L 33/62* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2004/0061433 A1* | 4/2004 | Izuno | H01L 21/76251 313/498 |
| 2010/0283062 A1 | 11/2010 | Hsieh et al. | |
| 2012/0104439 A1* | 5/2012 | Kim | H01L 33/501 257/98 |

(Continued)

FOREIGN PATENT DOCUMENTS

| | | |
|---|---|---|
| CN | 103383986 A | 11/2013 |
| KR | 101567900 B1 | 11/2015 |

*Primary Examiner* — Thien F Tran
(74) *Attorney, Agent, or Firm* — Patterson + Sheridan, LLP

(57) ABSTRACT

A light-emitting device includes a light-emitting element, a wavelength conversion layer, a light pervious element and a light-reflecting enclosure. The light-emitting element includes a top surface, a bottom surface, and a side surface between the top surface and the bottom surface. The wavelength conversion layer covers the top surface of the light-emitting element, and includes a plurality of wavelength conversion particles having an equivalent particle diameter D50. The light pervious element includes a recess structure and an outer wall. The light-reflecting enclosure surrounds the outer wall. The D50 of the wavelength conversion particles is not great than 10 μm. The recess structure is laterally overlapped with the side surface of the light-emitting element and the wavelength conversion layer.

20 Claims, 13 Drawing Sheets

(56) References Cited

U.S. PATENT DOCUMENTS

| | | |
|---|---|---|
| 2012/0217865 A1 | 8/2012 | Cabalu et al. |
| 2012/0236582 A1 | 9/2012 | Waragaya et al. |
| 2012/0267661 A1 | 10/2012 | Kim et al. |
| 2013/0062592 A1 | 3/2013 | Yen |
| 2014/0197436 A1 | 7/2014 | Kim |
| 2014/0312237 A1* | 10/2014 | Hosoi ..................... G21K 4/00 250/363.01 |
| 2016/0133788 A1 | 5/2016 | Kim et al. |

* cited by examiner

LIGHT-EMITTING DEVICE AND MANUFACTURING METHOD THEREOF

CROSS-REFERENCE TO RELATED APPLICATION

This application is a continuation application of U.S. patent application Ser. No. 15/395,917, filed on Dec. 30, 2016, which claims priority to and the benefit of TW Application Number 104144374 filed on Dec. 30, 2015, and the disclosure of which is incorporated by reference in its entirety.

BACKGROUND

Technical Field

The present disclosure relates to a light-emitting device and manufacturing method thereof, and in particular to a light-emitting device having a plurality of wavelength converting particles with small particle size and manufacturing method thereof.

Description of the Related Art

In the solid light emitting elements, light-emitting diodes (LEDs) have better energy efficient, low generating heat, longer life span, durable compact, smaller volume and shorter response time. Therefore, light-emitting diodes have been adopted widely in demands for light emitting elements within various fields, for instance, vehicles, home appliances, and lighting lamps.

There are several approaches to convert the color of a light emitted from LEDs to another color. For example, one approach is having a wavelength conversion layer, such as a phosphor layer, cover LEDs. Phosphor is a photoluminescence material and is also called a wavelength conversion material. Phosphor can absorb first light from LEDs to emit second light different from the first light. If the first light is not absorbed by the phosphor completely, the remaining first light can mix with the second light to generate mixing light of different color.

In addition, in different view angles, if ratios of mixing the first light emitted from LEDs and the converted second light are different, a distribution of the color or the color temperature in mixing light can be non-uniform.

SUMMARY OF THE DISCLOSURE

An embodiment of the application discloses a light-emitting device. The light-emitting device includes a light-emitting element, a wavelength conversion layer, a light pervious element and a light-reflecting enclosure. The light-emitting element includes a top surface, a bottom surface, and a side surface between the top surface and the bottom surface. The wavelength conversion layer covers the top surface of the light-emitting element and includes a plurality of wavelength conversion particles having an equivalent particle diameter D50. The light pervious element includes a recess structure and an outer wall. The light-reflecting enclosure surrounds the outer wall. The D50 of the wavelength conversion particles is not great than 10 μm. The recess structure is laterally overlapped with the side surface of the light-emitting element and the wavelength conversion layer.

DETAILED DESCRIPTION OF THE EMBODIMENTS

Figure 1A:
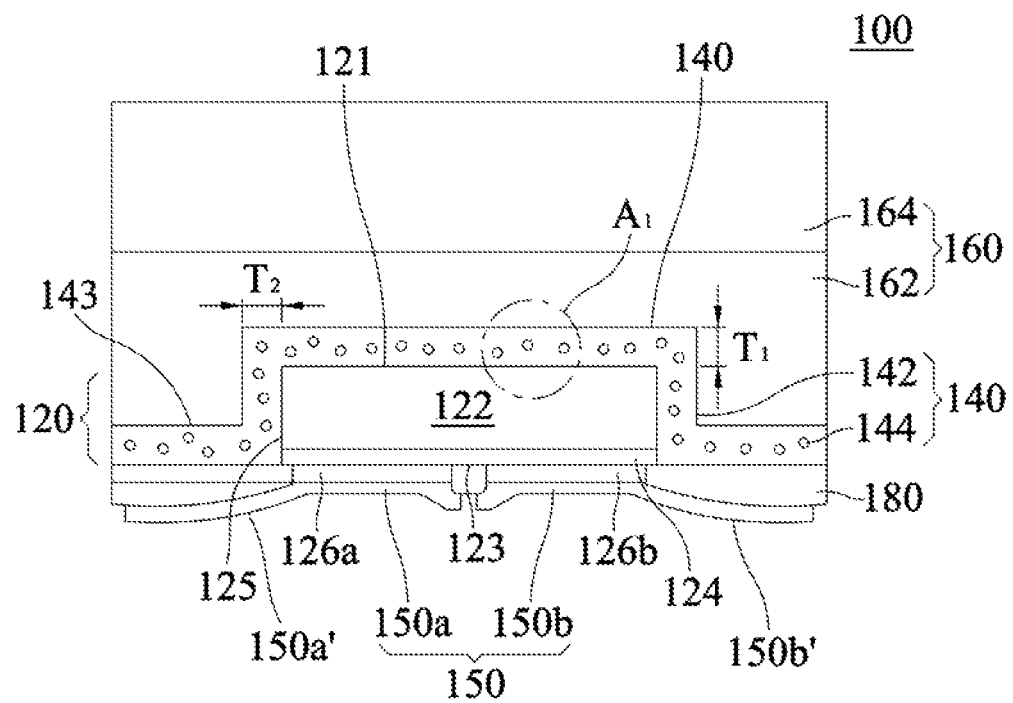
FIG. 1A is a cross sectional view of a light-emitting device in accordance with one embodiment of the present disclosure.

To better and concisely explain the disclosure, the same name or the same reference numerals given or appeared in different paragraphs or figures along the specification should has the same or equivalent meanings while it is once defined anywhere of the disclosure. In addition, these drawings are not necessarily drawn to scale. Likewise, the relative sizes of elements illustrated by the drawings may differ from the relative sizes depicted.

The following shows the description of embodiments of the present disclosure in accompany with the drawings.

FIG. 1A is a cross sectional view of a light-emitting device 100 in accordance with one embodiment of the present disclosure. Referring to FIG. 1A, the light-emitting device 100 includes a light-emitting element 120, a wavelength conversion layer 140 and a light pervious element 160. The wavelength conversion 140 covers a part of surfaces of the light-emitting element 120. Furthermore, the light pervious element 160 is located on the wavelength conversion 140.

In an embodiment, the light-emitting element 120 includes a growth substrate 122, a light-emitting structure 124 stacked by layers, and electrical contacts 126a and 126b. Moreover, a side of the light-emitting structure 124 is connected to the growth substrate 122. Another side is connected to the electrical contacts 126a and 126b. Furthermore, the light-emitting element 120 includes a top surface 121, a bottom surface 123 opposite to the top surface 122, and a plurality of side surfaces 125. The top surface 121 is connected to the bottom surface 123 by the side surfaces 125. In an embodiment, the light-emitting element 120 is a flip chip LED die. In another embodiment, the growth substrate 122 can be sapphire for light-emitting structure 124 being epitaxially grown on. Moreover, the growth substrate 122 has an outer surface for a light extracting surface like the top surface 121 of the light-emitting element 120. The growth substrate 122 should not be limited to what is disclosed in the present disclosure herein. In another embodiment, the growth substrate 122 can be removed or replaced by other substrate (different material, different structure or different shape) in the back-end process of the manufacture of the light-emitting device 100. In an embodiment, the light-emitting structure 124 includes a first semiconductor layer, an active layer, and a second semiconductor layer (not shown). In an embodiment, the first semiconductor layer can be an n-type semiconductor layer and the second semiconductor layer can be a p-type semiconductor layer. In an embodiment, electrical contacts 126a and 126b are disposed on the same side of the light-emitting element 120 as an interface to connect electrically the light-emitting element 120 and an external power. Moreover, outer surfaces of electrical contacts 126a and 126b are also a part of the bottom surface 123, and electrical contacts 126a and 126b can be electrically connected to the first semiconductor layer and the second semiconductor layer respectively. Electrical contacts 126a and 126b can be both extended to an elevation higher than a bottom surface of the wavelength conversion layer 140, to an elevation closer to the bottom surface (not shown), or only one contact is extended to an elevation higher than the bottom surface (not shown). In another embodiment, the light-emitting element 120 can be a vertical LED die/chip with electrical contacts 126a and 126b arranged on the two opposite sides of the LED die/chip, and electrical contacts 126a and 126b can be electrically connected to the first semiconductor layer and the second semiconductor layer respectively.

In an embodiment, the light-emitting element 120 includes four side surfaces 125 wherein the opposite side surfaces are parallel to each other. In the other word, the appearance of the light-emitting element 120 is rectangle or parallelogram. The top surface 121 is substantially parallel to the bottom surface 123. The light-emitting element 120 can be an LED die/chip, such as blue LED die/chip or UV LED die/chip. In one embodiment, the light-emitting element 120 is a blue LED die/chip which can emit a light having a dominant wavelength or a peak wavelength in the range of 410 nm and 490 nm.

The wavelength conversion layer 140 can include a transparent binder 142 and a plurality of wavelength conversion particles 144 dispersed within the transparent binder 142. The wavelength conversion particles 144 can absorb first light from the light-emitting element 120 to emit second light with different spectrum. In one embodiment, the wavelength conversion particles 144 absorb first light, such as blue light or UV light, and then convert to second light, for example, yellow light with a dominant wavelength or a peak wavelength in the range of 530 nm and 590 nm. In another embodiment, the wavelength conversion particles 144 absorb first light, such as blue light or UV light, and then convert to second light like yellowish green light with a dominant wavelength or a peak wavelength in the range of 515 nm and 575 nm. In another embodiment, the wavelength conversion particles 144 absorb first light, such as blue light or UV light, and then convert to second light like red light with a dominant wavelength or a peak wavelength in the range of 590 nm and 650 nm.

The wavelength conversion layer 140 can include single or various kinds of wavelength conversion particles 144. In one embodiment, the wavelength conversion layer contains the wavelength conversion particles 144 capable of emitting yellow light. In another embodiment, the wavelength conversion layer 140 has many kinds of wavelength conversion particles 144 capable of emitting yellowish green light and red light.

The wavelength conversion particles 144 can be dispersed in the transparent binder 142, which can fix relative positions between the wavelength conversion particles 144 and conduct heat from the wavelength conversion particles 144. The concentration of the wavelength conversion particles 144 in the wavelength conversion layer 140 can be changed by adjusting weight ratios of the transparent binder 142 and the wavelength conversion particles 144. The higher the concentration of the wavelength conversion particles 144 is, the more the light in the light-emitting element 120 is converted to a different light, which means higher conversion ratio. Furthermore, in one embodiment, a weight ratio of the wavelength conversion particles 144 to the wavelength conversion layer 140 is higher, and the effect of scattering light is more obvious while a weight ratio of the wavelength conversion particles 144 to the wavelength conversion layer 140 is less than 70%. If the concentration of the wavelength conversion particles 144 is too high, there is no sufficient transparent binder 142 to sustain the wavelength conversion particles 144. In one embodiment, a weight ratio of the wavelength conversion particles 144 to the wavelength conversion layer 140 is less than 70%. In another embodiment, a weight ratio of the wavelength conversion particles 144 to the wavelength conversion layer 140 is in the range of 30% and 60%. The wavelength conversion particles 144 with the weight ratio of the above-mentioned range can provide a better conversion ratio and scattering effect and can be fixed effectively in the position. In addition, the transparent binder 142 can have a higher transparency, such as 80%, 90%, 95% or 99% transparency so that the first light exciting the wavelength conversion particles 144 and the second light emitted from the wavelength conversion particles 144 have higher light extraction efficiency.

The transparent binder 142 can be a thermosetting resin, for example, a silicone resin or an epoxy resin. In an embodiment, the transparent binder 142 is silicone resin. Moreover, a composition of the silicone resin can be adjusted depending on the demands of physical properties or optical properties. In one embodiment, the transparent binder 142 contains aliphatic silicone, such as methyl siloxane, with a greater ductility so as to sustain thermal stress from the light-emitting element 120. In another embodiment, the transparent binder 142 has aromatic silicone, such as phenyl siloxane, with a higher refractive index so as to increase light extraction efficiency. When a difference of refractive indices between the transparent binder 142 and a material in an output-light portion of the light-emitting element 120 is smaller, an angle of output light is greater so that light extraction efficiency can be increased. In one embodiment, the material of the output-light portion of the light-emitting element 120 is sapphire which has a refractive index of about 1.77 while the transparent binder 142 is made of aromatic silicone with a refractive index of about 1.50.

Particle sizes of the wavelength conversion particles can be designated as D50, which is defined by the particle diameter of the particle intercepting 50% of the cumulative mass in a distribution of the wavelength conversion particles 144. In one embodiment, the D50 of the wavelength conversion particles is not greater than 10 µm. In another embodiment, the D50 of the wavelength conversion particles is in the range of 1 µm to 8 µm. When the wavelength conversion particles 144 is greater than 10 µm, the wavelength conversion particles 144 scattering the first light and second light is not sufficient so that mixing the first light and the second light is not good. Therefore, a color distribution of the mixed light is not uniform under different view angle. When the D50 of the wavelength conversion particles 144 is less than 1 µm, the wavelength conversion efficiency thereof is lower. Therefore, an amount of the wavelength conversion particles 144 has to be added more so the wavelength conversion particles 144 have an excessive scattering to cause energy loss from light moving in the transparent binder 142. In one embodiment, when the weight percentage of the wavelength conversion particles 144 to the wavelength conversion layer 140 is less than 70% and the D50 thereof is in the range of 1 μm to 8 μm, the wavelength conversion particles 144 has a better light scattering.

Material of the wavelength conversion particles 144 can include inorganic phosphor, organic fluorescent colorants, semiconductors, or combinations thereof. The semiconductor material includes crystal size in a nano-scale thereof, such as quantum dot luminescent material. In one embodiment, the material of the wavelength converting particles 144 is phosphor, which can be $Y_3Al_5O_{12}$:Ce, $Gd_3Ga_5O_{12}$:Ce, $(Lu, Y)_3Al_5O_{12}$:Ce, $Tb_3Al_5O_{12}$:Ce, SrS:Eu, $SrGa_2S_4$:Eu, $(Sr, Ca, Ba)(Al, Ga)_2S_4$:Eu, (Ca, Sr)S:(Eu, Mn), (Ca, Sr)S:Ce, $(Sr, Ba, Ca)_2Si_5N_8$:Eu, (Sr, Ba, Ca)(Al, Ga)SiN$_3$:Eu, CaAlSiON:Eu, $(Ba, Sr, Ca)_2SiO_4$:Eu, $(Ca, Sr, Ba)Si_2O_2N_2$:Eu, $K_2SiF_6$:Mn, $K_2TiF_6$:Mn, and $K_2SnF_6$:Mn. The semiconductor material can include II-VI semiconductor compound, III-V semiconductor compound, IV-VI semiconductor compound, or combinations thereof. The quantum dot luminescent material can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, and CuInS.

The thicknesses T, T1, and T2 of the wavelength conversion layer 140 and the particle size thereof can jointly affect the light-emitting performance of the light-emitting device 100. In one embodiment, the thickness T1 of the wavelength conversion layer 140 is greater than the thickness T2. In another embodiment, the thickness T1 of the wavelength conversion layer 140 is substantially equal to the thickness T2. In one embodiment, a ratio of the average thickness T of the wavelength conversion layer to the D50 of the wavelength conversion particles is in the range of 6 to 20 while the average thickness T is defined as the average of the thickness T1 and the thickness T2. In another embodiment, a ratio of the average thickness T of the wavelength conversion layer to the D50 of the wavelength conversion particles is in the range of 8 to 15. With the same amount of the wavelength conversion particles, the density of the wavelength conversion particles 144 is too high when a ratio of the average thickness T of the wavelength conversion layer to the D50 of the wavelength conversion particles is less than 6. In that case, it is difficult for the first light and second light in the wavelength conversion layer 140 to exit because substantial portions of the first light and the second light are scattered by the wavelength conversion particles 144 in the wavelength conversion layer 140. In contrast, a ratio of the average thickness T of the wavelength conversion layer to the D50 of the wavelength conversion particles is greater than 20 so as to decrease brightness because the first light and the second light have larger routes in the transparent binder 142 that may cause energy loss. In one embodiment, the D50 of the wavelength conversion particles is in the range of 2.5 μm to 4 μm, the average thickness T of the wavelength conversion layer is in the range of 35 μm to 50 μm, and a weight percentage of the wavelength conversion particles 144 to the wavelength conversion layer 140 is in the range of 35% and 60% so a ratio of the average thickness T of the wavelength conversion layer to the D50 of the wavelength conversion particles is in the range of 8.75 to 20.

In one embodiment, the thickness T1 of the wavelength conversion layer 140 is close to the thickness T2 thereof, and the difference between the thickness T1 and the thickness T2 is not greater than 10% of the average of the thickness T2 and the thickness T1. Moreover, the difference between the maximum thickness of the wavelength conversion layer 140 and the average of the thickness, and/or the difference between the minimum thickness thereof and the average of the thickness is not greater than 10% of the average of the thickness. Therefore, the distances for the first light and the second light passing through the wavelength conversion layer 140 are as close as possible.

The wavelength conversion layer 140 can cover one or more light extracting surfaces of the light-emitting element 120. In one embodiment, the light extracting surfaces of the light-emitting element 120 include a top surface 121 and a side surface 125. In one embodiment, the wavelength conversion layer 140 directly contacts the top surface 121 and a plurality of side surfaces 125 of the light-emitting element 120. In another embodiment, the wavelength conversion layer 140 covers or directly contacts only the top surface 121, but not covers or not directly contacts the side surfaces 125. In one embodiment, in addition to covering the light-emitting element 120, the wavelength conversion layer 140 extends outward the side surface 125 of the light-emitting elements to form an extending portion 143. In another embodiment, the wavelength conversion layer 140 only covers the light-emitting element 120.

Figure 1B:
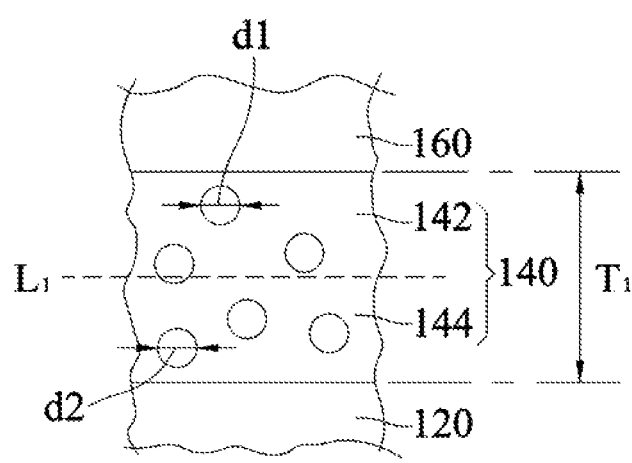
FIG. 1B is an enlarged view of the dashed circle in FIG. 1A.

Referring to FIG. 1B, the wavelength conversion layer 140 comprises an upper section and a bottom section separated by a virtual line L1 which locates in the middle of the thickness T1. The difference between the average of particle sizes of the wavelength conversion particles 144 in the upper section and the average of particle sizes of the wavelength conversion particles 144 in the bottom section is smaller than 10%. A shape of the wavelength conversion particles 144 can be regular or irregular. The regular shape includes circular or ellipse. The irregular shape includes asymmetric shape. An average of particle sizes of the wavelength conversion particles 144 is defined by the average of the maximum particle size and the minimum particle size.

Referring to FIG. 1A, the light pervious element 160 is formed on the light-emitting element 120 and the wavelength conversion layer 140 so as to protect the light-emitting element 120 and the wavelength conversion layer 140. Furthermore, the light pervious element 160 has an outermost surface as a light extracting surface of the light-emitting device 100. Besides providing protection to the light-emitting element 120, the light pervious element 160 also provides support to the light-emitting device 100. In an embodiment, the light pervious element 160 has a light pervious adhesive layer 162 and a light pervious substrate 164. The material of the light pervious adhesive layer 162 can depend on the material of the light pervious substrate 164, such as silicone resin or epoxy resin. In an embodiment, the light pervious substrate 164 is glass and the light pervious adhesive layer 162 is silicone resin. The light pervious substrate 164 is rigid enough to supply support to the light-emitting device 100. A material of the light pervious substrate 164 can be glass or fused quartz. In an embodiment, the wavelength conversion layer 140 has a refractive index in the range of 1.45 to 1.80. In an embodiment, the light pervious adhesive layer 162 has a refractive index in the range of 1.40 to 1.60. In an embodiment, the light pervious substrate 164 has a refractive index in the range of 1.45 to 1.90. The refractive index of the light pervious adhesive layer 162 can be the same as or different from the light pervious substrate 164. In an embodiment, the refractive index of the light pervious adhesive layer 162 is greater than the light pervious substrate 164 and between the wavelength conversion layer 140 and the light pervious substrate 164.

Referring to FIG. 1A, a lower surface of the extending portion 143 of the wavelength conversion layer 140 and the bottom surface 123 can be covered by the light-reflecting layer 180. The light-reflecting layer 180 can reflect the first light and the second light directing to the light extracting surface. In an embodiment, the extending portion 143 of the wavelength conversion layer 140 directly contacts the light-reflecting layer 180. When the light-reflecting layer 180 is connected to the extending portion 143 of the wavelength conversion layer 140, the wavelength conversion layer 140 in the light-emitting device 100 has higher bonding strength so as to decrease a risk of peeling of the wavelength conversion layer 140. The light-reflecting layer 180 can be made by light-reflecting and non-conductive material. In one embodiment, the light-reflecting material can be $TiO_2$, $ZrO_2$, $Nb_2O_5$, $Al_2O_3$, $SiO_2$, $MgF_2$ or AlN. In another embodiment, the light-reflecting material is formed of mixing the particle of above-mentioned material and binding agent. The binding agent can be silicone resin, acrylic resin or epoxy resin.

Referring to FIG. 1A, lower surfaces of electrical contacts 126a and 126b can be covered by extension pads 150a and 150b (collectively numbered 150) respectively. In an embodiment, the extension pads 150a and 150b cover the electrical contacts 126a, 126b and a portion of the light-reflecting layer 180. As the figure shows, the extension pads 150a and 150b extend inward to close to each other, and extend outward to a position before reaching the outer boundary of the light-reflecting layer 180. However, the extension pads 150a and 150b can also extend to the outer boundary of the light-reflecting layer 180 (not shown). In an embodiment, the surface area of the extension pad 150a is greater than the surface area of the electrical contact 126a and/or the surface area of the extension pad 150b is greater than the surface area of the electrical contact 126b. In one embodiment, the thickness of the light-reflecting layer 180 is greater than the respective thickness of the electrical contacts 126a and 126b. When the extension pads 150a, 150b extend to upside of the light-reflecting layer 180 from the electrical contacts 126a and 126b, the extension pads 150a, 150b respectively forms an inclined plane 150a', 150b' because of a gap between the light-reflecting layer 180 and the electrical contact 126. In another embodiment, the electrical contacts 126a and 126b have a coplanar (not shown) with the light-reflecting layer 180 so there is no inclined plane. Extension pads 150a, 150b are made of high electrically conductive material, such as Cu, Ag or Au. In an embodiment, the extension pads 150a, 150b can be formed by electroplating.

Figure 1C:
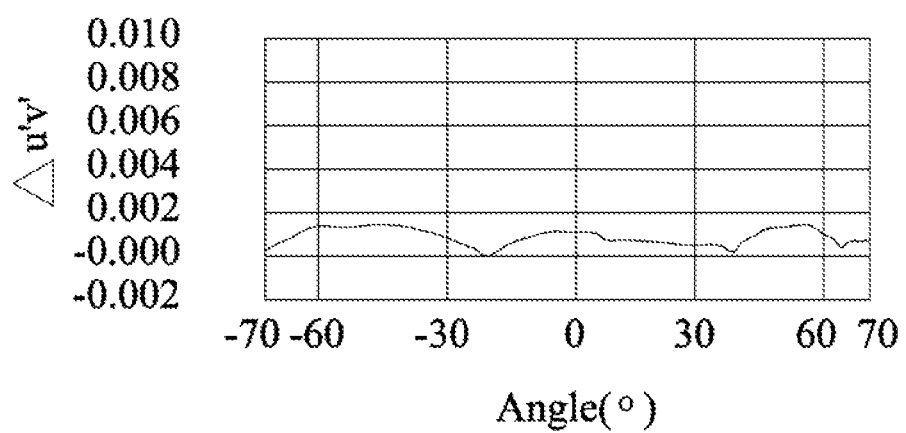
FIG. 1C is the divergence of the color coordinate as a function of the angle of view in accordance with one embodiment of the present disclosure.

FIG. 1C illustrates the divergence of the color coordinate as a function of the angle of view in accordance with one embodiment of the present disclosure in FIG. 1A. The coordinate X indicates the angle of view. Furthermore, 0° is corresponding to a direction vertical to the top surface 121. 90° and −90° are respectively corresponding to two opposite directions parallel to the top surface 121. $\Delta u'v'$ shown on coordinates Y indicates the distance between an arbitrary point (target point) and a reference point ($u_0'$, $v_0'$) on the CIE1976 color space. In other words, the lager $\Delta u'v'$ means the distance between the target point and the reference point is lager and the mixing ratio of the first light and the second light has larger difference with the average value. $\Delta u'v' = (\Delta u'^2 + \Delta v'^2)^{1/2}$, $\Delta u' = u' - u_0'$, $\Delta v' = v' - v_0'$, $u'$ and $v'$ indicate the color coordinates of the target point on the CIE1976 color space. The reference point ($u_0'$, $v_0'$) is defined as the average value of the color coordinates over all angles of the emitted light.

In the angle distribution, less variation of $\Delta u'v'$ means the color distribution over different angle of view is more uniform. In one embodiment, the difference of $\Delta u'v'$ is less than 0.0040 in the color distribution over the angle of view ranged from 0° to 70° in the light-emitting device. In FIG. 1C, the difference of $\Delta u'v'$ is less than 0.0030 over the range of 0° to 70° angle (or 0° to −70°). In FIG. 1C, the difference of $\Delta u'v'$ is less than 0.0015 over the range of 0° to 30° angle (or 0° to −30°). Moreover, in FIG. 1C, the difference of $\Delta u'v'$ is less than 0.0020 over the range of 30° to 70° angle (or −30° to −70°).

Figure 2A:
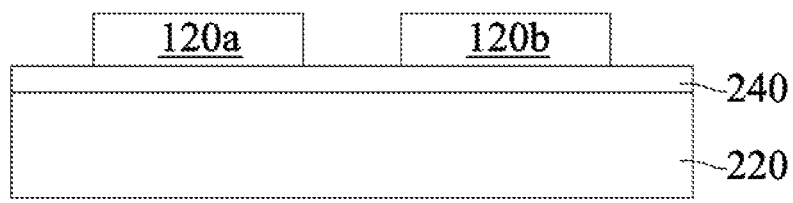
FIGS. 2A-2J illustrate a manufacturing flow of the light-emitting device in accordance with one embodiment of the present disclosure.

FIG. 2A~FIG. 2J illustrate a manufacturing flow of the light-emitting device 100 in accordance with one embodiment of the present disclosure. Referring to FIG. 2A, a temporary carrier 220, light-emitting elements 120a, 120b, and an adhesive layer 240 for fixing the light-emitting elements 120a, 120b on the temporary carrier 220 are provided. The number of the light-emitting elements is an example and is not limited to two. In one embodiment, the temporary carrier 220 can be glass, sapphire substrate, metal plate or plastic plate, and the adhesive layer 240 can be UV curing adhesive.

Figure 2B:
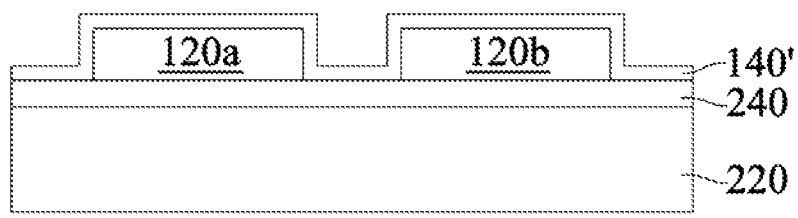

Referring to FIG. 2B, a wavelength conversion sheet 140' is formed on the temporary carrier 220 and covers the light-emitting elements 120a and 120b. The wavelength conversion sheet 140' is a sheet structure formed beforehand which is mixed by the plurality of wavelength conversion particles and the transparent adhesive. The size of the sheet structure can be adjusted based on the requirement, for example, the sheet structure is formed by the plurality of wavelength conversion sheets, and each of the wavelength conversion sheets is separated from each other. The plurality of separated wavelength conversion sheets covers the plurality of light-emitting elements correspondingly as a batch or in order. That is to say, one of the wavelength conversion sheets 140' covers only one or few light-emitting elements. For example, the quantity ratio of the light-emitting elements being covered to all light-emitting elements disposed on the temporary carrier 220 is smaller than 1/50, 1/100, or 1/200. In another embodiment, the sheet structure is formed as a tape which can continuously cover the plurality of light-emitting elements in one step. In other words, one wavelength conversion sheet 140' can cover multiple or all light-emitting elements. For example, the quantity ratio of the light-emitting elements being covered on the temporary carrier 220 to all light-emitting elements disposed on the carrier 220 is more than 1/50, 1/100, or 1/200. In an embodiment, the wavelength conversion sheet 140' is laminated on the top of the light-emitting elements 120a and 120b. The lamination is made by tightly sealing an upper mold (the wavelength conversion sheet can be disposed on the upper mold; not shown) and a lower mold (the light-emitting element can be disposed on the lower mold; not shown), and heating and pressuring the wavelength conversion sheet 140' at the same time to soften the wavelength conversion sheet 140' so the light-emitting elements 120a, 120b can be connected tightly. Alternatively, the air is extracted out when the upper mold is very close to the lower mold and the wavelength conversion sheet 140' does not contact the light-emitting elements 120a, 120b. The air bubble between the wavelength conversion sheet 140' and the light-emitting elements 120a, 120b can be eliminated so that the bonding strength can be enhanced. In an embodiment, the wavelength conversion sheet 140' further includes a substrate (not shown) to support the wavelength conversion sheet 140'. In one embodiment, the substrate has a worse flexible, and that is why the substrate have to be removed beforehand so the wavelength conversion sheet 140' is laminated tightly on the light-emitting elements 120a, 120b by extracting air afterward. In another embodiment, the substrate has a better flexible. Therefore, it is not necessary to remove the substrate beforehand. After laminating the wavelength conversion sheet 140' on the light-emitting elements 120a, 120b by extracting air, the substrate can be removed. Material of the substrate can be polymer, such as polyethylene or polyester.

Figure 2C:
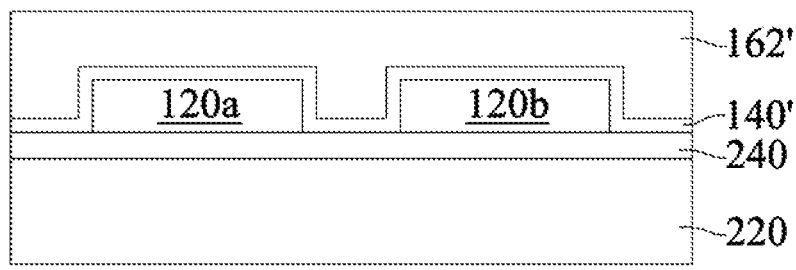

Referring to FIG. 2C, a light pervious adhesive 162' is formed on the wavelength conversion sheet 140'. In one embodiment, by molding, heating and pressing the light pervious adhesive 162' can cover the top surface of the wavelength conversion sheet 140' and fill in the concave portion between the light-emitting elements 120a and 120b. In another embodiment, the other way of forming the light pervious adhesive 162' includes coating or laminating. In an embodiment, the light pervious adhesive 162' is of semi-curing state and also called B-stage adhesive.

Figure 2D:
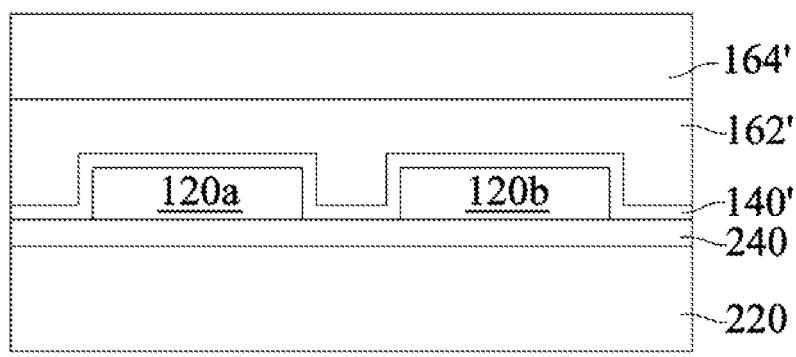

Referring to FIG. 2D, a light pervious substrate 164' is formed on and adhered to the light pervious adhesive 162'. In an embodiment, the light pervious substrate 164' is adhered to the light pervious adhesive 162' by heating. An adhering temperature is greater than 140° C. In another embodiment, the light pervious adhesive 162' is connected to the wavelength conversion sheet 140' and the light pervious substrate 164' and is transformed to curing state, or called c-stage adhesive, after heating. Because the adhering temperature between the light pervious substrate 164' and the light pervious adhesive 162' is greater than 140° C., the adhesive layer 240 has to withstand the temperature above 140° C. to prevent from thermal decomposition which damage the function of fixing of the light-emitting elements 120a, 120b and the temporary carrier 220. In one embodiment, the adhesive layer 240 is heat-resistant UV curing adhesive.

Figure 2E:
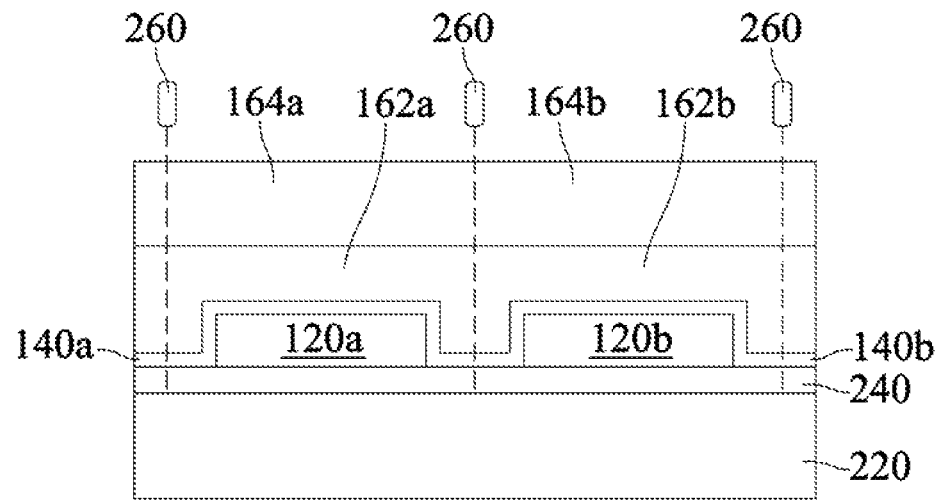

Referring to FIG. 2E, by a separation process, the light-emitting elements 120a, 120b, the wavelength conversion sheet 140' stacked thereon, light pervious adhesive 162' and the light pervious substrate 164' are separated. The wavelength conversion sheet 140' is transformed to wavelength conversion layers 140a, 140b after the separation process. The light pervious adhesive 162' is transformed to light pervious layers 162a, 162b after the separation process. Moreover, the light pervious substrate 164' is transferred to light pervious substrate 164a, 164b after the separation process. The separation process includes cutting the light pervious substrate 164', the light pervious adhesive 162' and the wavelength conversion sheet 140' in order by the cutting tool 260. The step of cutting can be one time or multiple times. In one embodiment, the multiple-time cutting means cutting the light pervious substrate 164' by the cutting tool beforehand and cutting the light pervious adhesive 162' and the wavelength conversion sheet 140' by another cutting tool afterward.

Figure 2F:
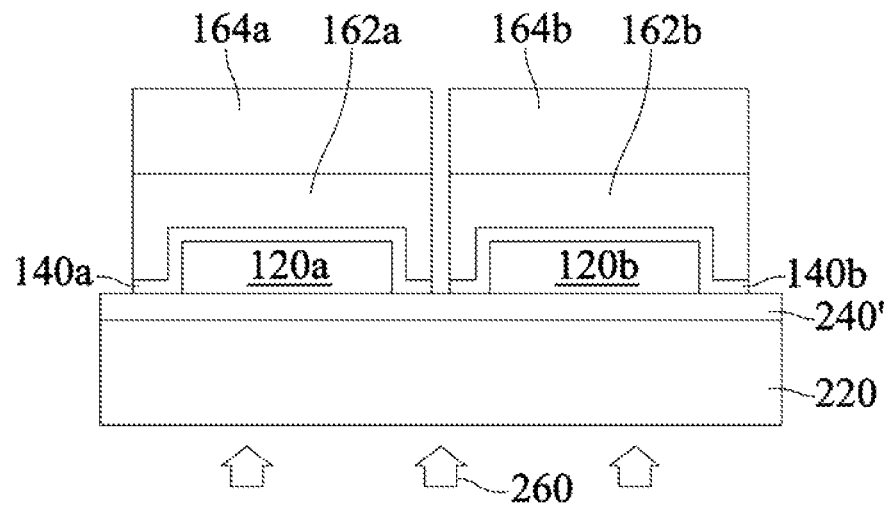
Figure 2G:
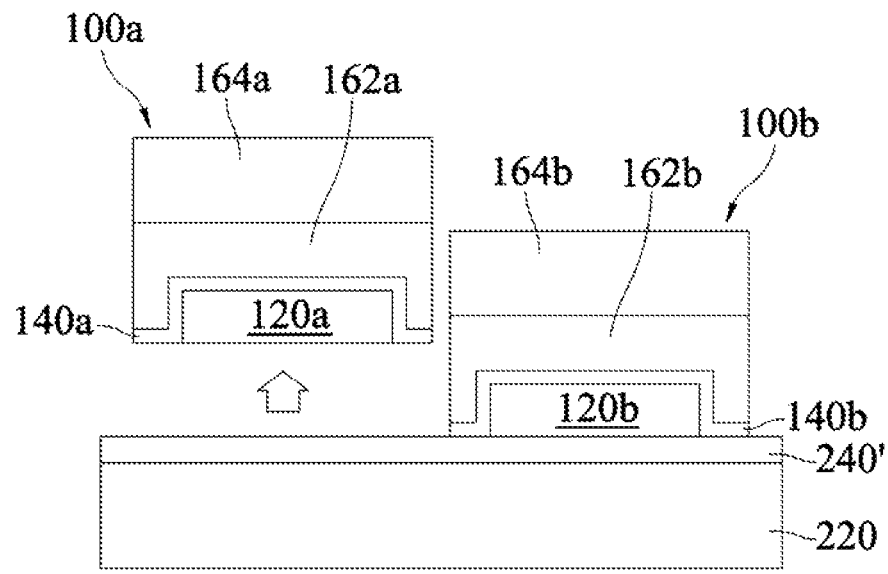
Figure 2H:
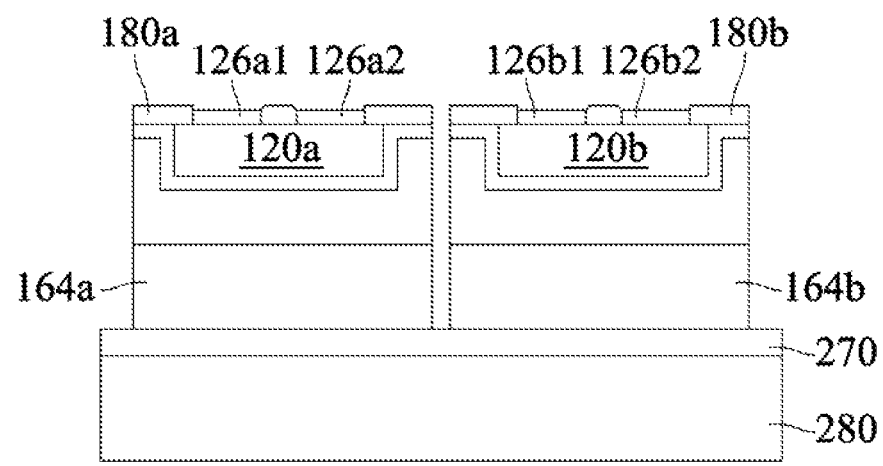

Referring to FIG. 2F, the stickiness of the adhesive 240 decreases or disappears by supplying energy, such as irradiating energy or thermal energy. In one embodiment, the adhesive 240 is UV curing adhesive, and the temporary 220 is transparent material, such as glass, sapphire substrate and so on. In the embodiment, UV light is emitted from the direction of the temporary carrier to cure the UV curing adhesive 240' and then the stickiness of the UV curing adhesive 240' is decreased. Referring to FIG. 2G, the light-emitting devices 100a', 100b' are picked up after curing the UV curing adhesive 240'.

In accordance with one embodiment of FIG. 1A, the light-reflecting layer 180 and the extension pad 150 yet have to be formed on the bottom surfaces of the light-emitting elements 120a, 120b. Referring to FIG. 2G, the light-emitting devices 100a, 100b are adhered to another temporary carrier 280 by an adhesive 270 after reversing the light-emitting devices 100a, 100b. Furthermore, the light pervious substrates 164a, 164b are fixed by the adhesive 270. Light-reflecting layers 180a, 180b are respectively formed around electrical contacts 126a1, 126a2 of the light-emitting element 120a and electrical contacts 126b1, 126b2 of the light-emitting element 120b. The light-reflecting layers 180a, 180b can bulge or coplanar with the electrical contacts 126a1, 126a2 and 126b1, 126b2. The light-reflecting layers 180a, 180b can be formed by screen-printing or lithography.

Figure 2I:
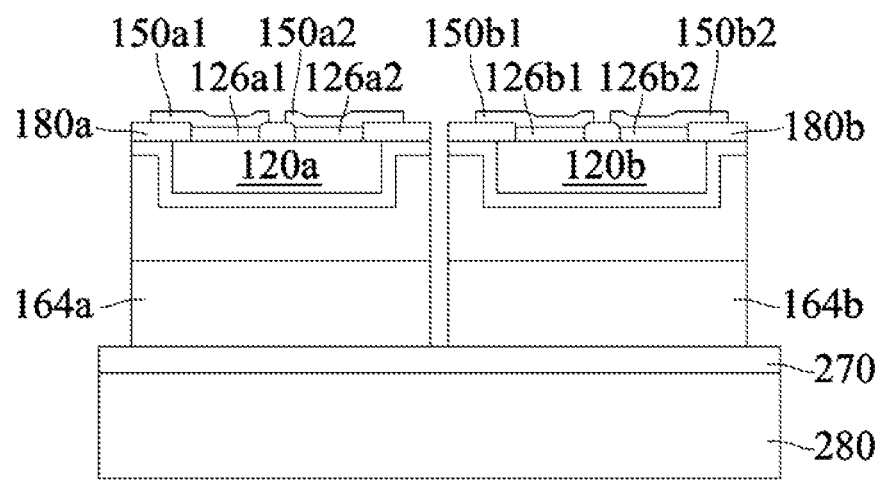

Referring to FIG. 2I, extension pads 150a1, 150a2 and 150b1, 150b2 are formed on the electrical contacts 126a1, 126a2 and 126b1, 126b2, respectively. In an embodiment, the extension pads 150a1, 150a2 and 150b1, 150b2 are formed by electroplating. If the light-reflecting layer 180 and/or the extension pad 150 are not required, the step of FIG. 2G and/or FIG. 2I can be omitted.

Figure 2J:
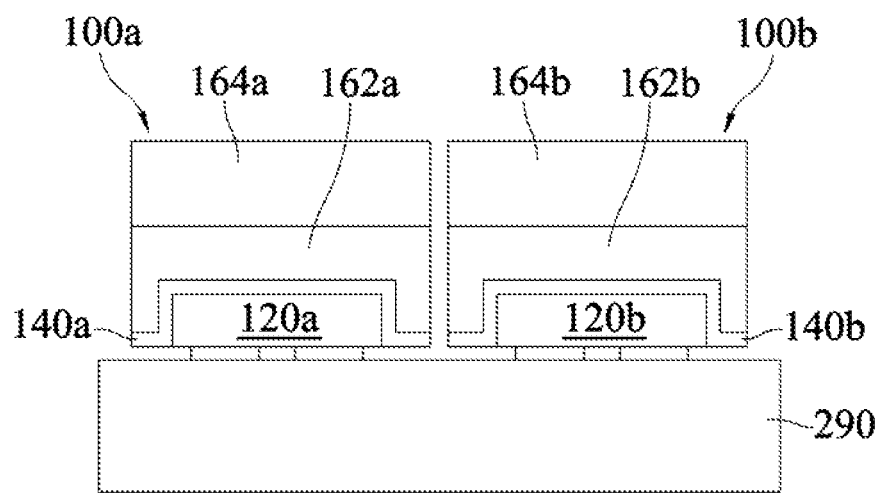

Referring to FIG. 2J, in one embodiment, the light-emitting devices 100a, 100b are reversed afterward being adhered to another temporary carrier 290. The temporary carrier 290 can be blue film. In another embodiment, the light-emitting devices 100a, 100b can be picked and placed in the rolled tape in order.

Figure 3A:
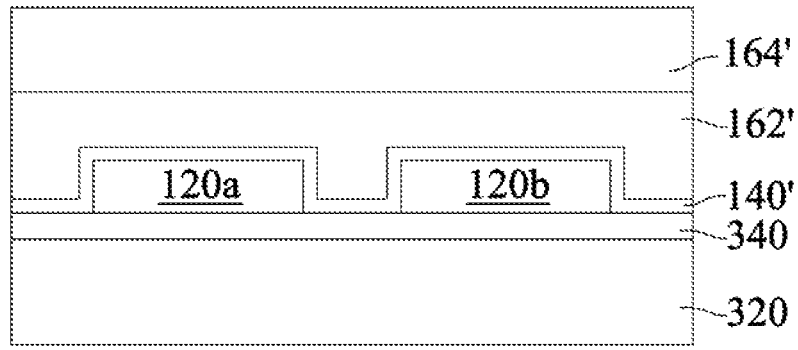
FIGS. 3A-3F illustrate a manufacturing flow of the light-emitting device in accordance with another embodiment of the present disclosure.

FIGS. 3A~3F illustrate a manufacturing flow of the light-emitting device 100 in accordance with another embodiment of the present disclosure. The steps prior to FIG. 3A can be the same as or similar with those in FIG. 2A to FIG. 2C. FIG. 3A can be the same as or the similar with FIG. 2D.

Figure 3B:
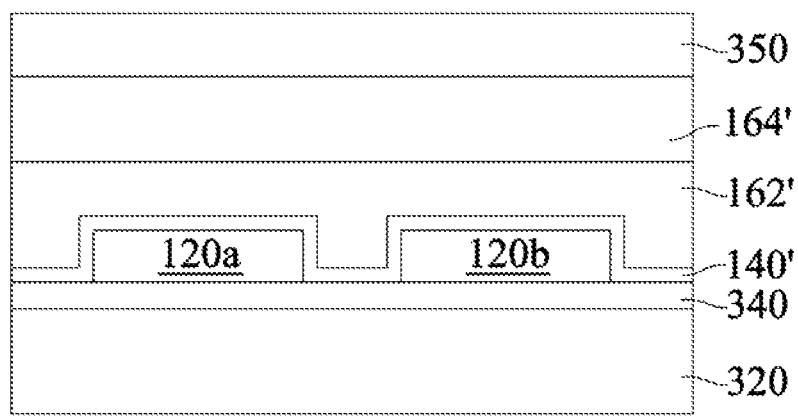
Figure 3C:
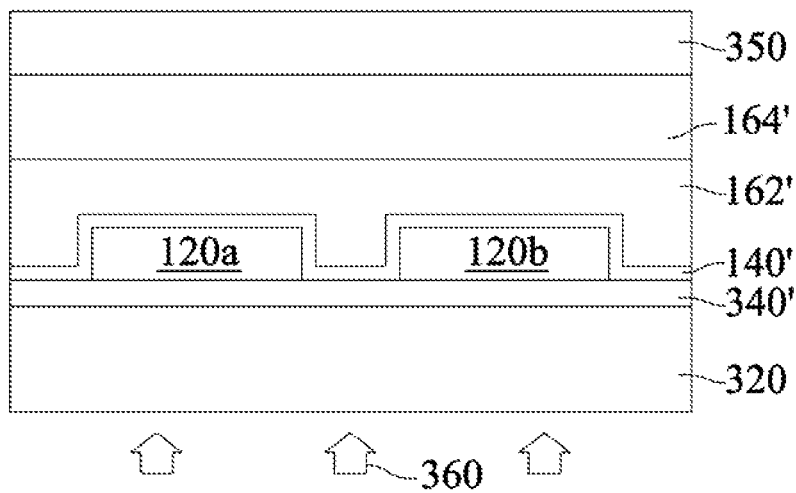

Referring to FIG. 3B, another temporary carrier 350 are provided and attached to the other side of the light pervious substrate 164'. The temporary carrier 350 has an adhesive layer (not shown) so as to fix the light pervious substrate 164' on the temporary carrier 350. Referring to FIG. 3C, the stickiness of the adhesive layer 340 is decreased or disappears to form a post adhesive layer 340' with energy provided thereto. The structures, functions and making methods of the adhesive layer 340 can refer to previous description.

Figure 3D:
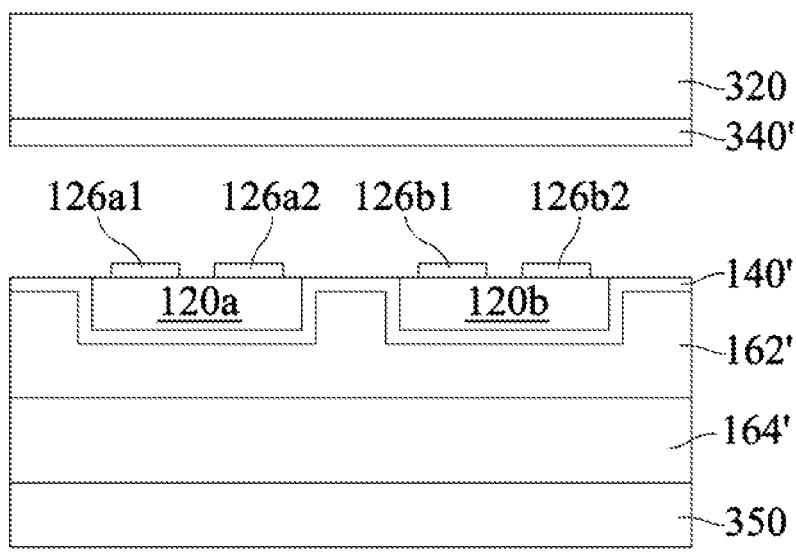
Figure 3E:
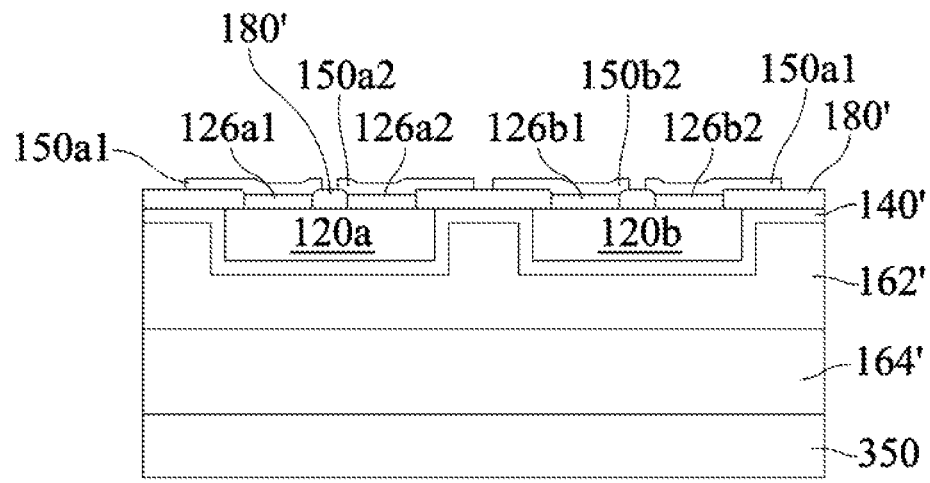

Referring to FIG. 3D, the post adhesive layer 340' is separated from the light-emitting elements 120a, 120b. Simultaneously, the light-emitting elements 120a, 120b expose the electrical contacts 126a1, 126a2 and 126b1, 126b2, respectively. Referring to FIG. 3E, a light-reflecting layer 180' and the extension pads 150a1, 150a2 and 150b1, 150b2 are formed in order. The structures, functions and making methods of the light-reflecting layer 180' and the extension pads 150a1, 150a2 and 150b1, 150b2 can refer to previous description.

Figure 3F:
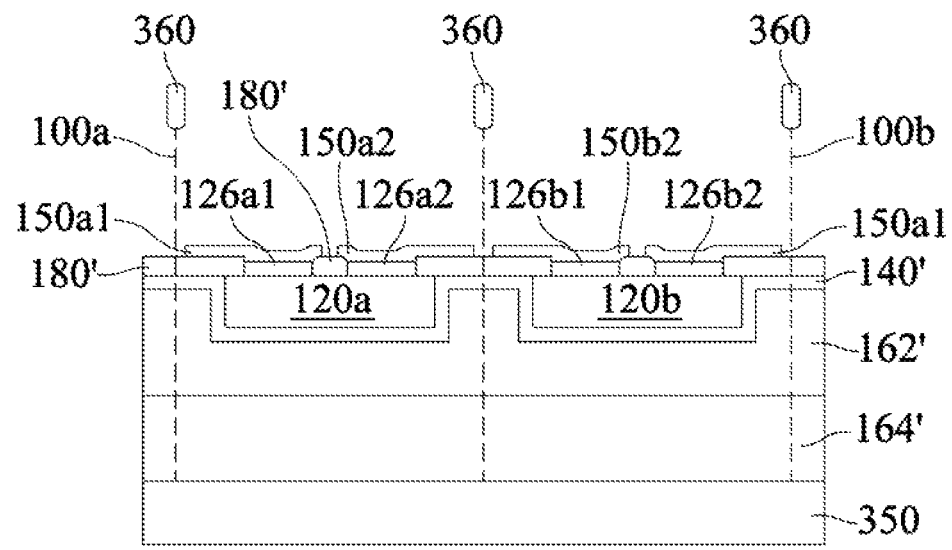

Referring to FIG. 3F, the light-reflecting layer 180', the wavelength conversion sheet 140', the light pervious adhesive 162', the light pervious substrate 164' are all severed by the separation process. The light-reflecting layer 180' is transformed to light-reflecting layers 180a, 180b, the wavelength conversion sheet 140' is transformed to wavelength conversion layer 140a, 140b, and the light pervious adhesive 162' is transformed to light pervious adhesive layers 162a, 162b, and the light pervious substrate 164' is transformed to light pervious substrates 164a, 164b. In one embodiment, the separation process includes cutting for multiple times by the cutting tools. For example, the light-reflecting layer 180', the wavelength conversion sheet 140', and the light pervious adhesive 162' are cut by the first cutting tool, and then the light pervious substrate 164' is cut by the second cutting tool. In another embodiment, the light-reflecting layer 180', the wavelength conversion sheet 140', the light pervious adhesive 162', the light pervious substrate 164' are all cut by one cutting tool at one time.

Figure 4:
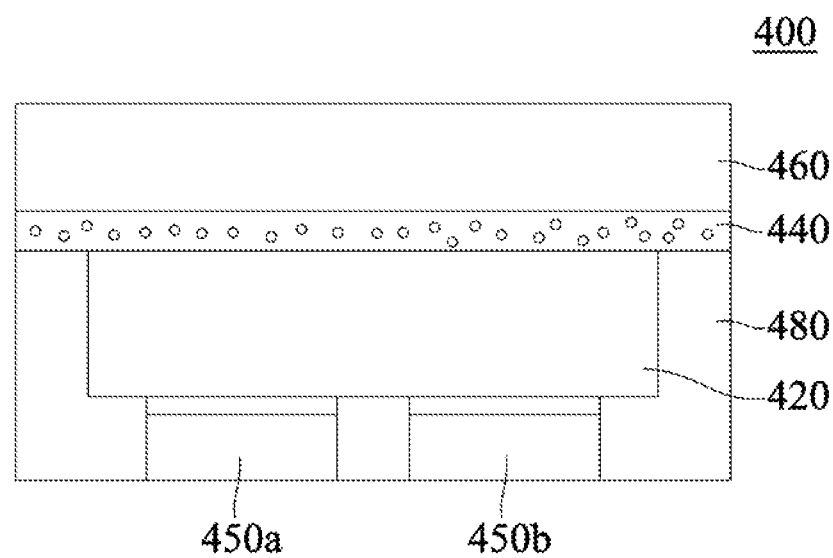
FIG. 4 is a cross-sectional view of a light-emitting device in accordance with another embodiment of the present disclosure.

FIG. 4 is a cross-sectional view of a light-emitting device 400 in accordance with another embodiment of the present disclosure. The light-emitting device 400 includes a light-emitting element 420, a wavelength conversion layer 440, a light pervious element 460 and a light-reflecting enclosure 480. The wavelength conversion layer 440 covers a part of the surface of the light-emitting element 420. In addition, the light pervious element 460 is arranged on the wavelength conversion layer 440. The light-reflecting enclosure 480 surrounds side surfaces of the light-emitting element 420.

The structures, functions and making methods of the light-emitting element 420, the wavelength conversion layer 440 and the light pervious element 460 can refer to the paragraphs related with FIG. 1. The material of the reflecting enclosure 480 can be the same as or the similar with the light-reflecting layer 180. Furthermore, making methods of the light-reflecting enclosure 480 can be molding or laminating the light-reflecting sheet. In one embodiment, the wavelength conversion layer 440 covers the top surface of the light-emitting element 420 and extends to a portion above the top surface of the light-reflecting enclosure 480. In another embodiment, the wavelength conversion layer 440 is a flat and non-bending structure so the wavelength conversion layer 440 does not have a stress in the bending portion to decrease a risk of the crack by the stress. In an embodiment, the light-emitting device 400 further includes electrical pads 450a, 450b electrically connecting to the light-emitting element 420 and surrounded by the light-reflecting enclosure 480. Electrical pads 405a, 450b can be metal or alloy with high conductivity, such as Cu.

Figure 5:
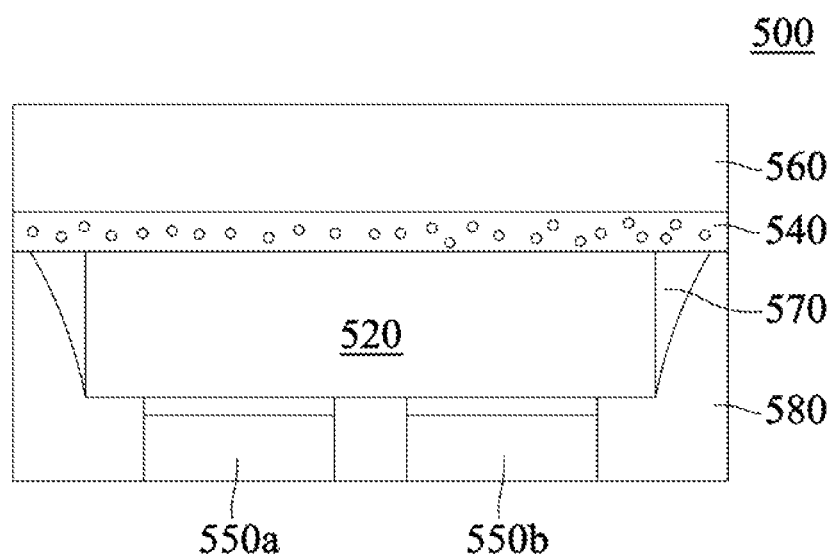
FIG. 5 is a cross-sectional view of a light-emitting device in accordance with another embodiment of the present disclosure.

FIG. 5 is a cross-sectional view of a light-emitting device 500 in accordance with another embodiment of the present disclosure. The light-emitting device 500 includes a light-emitting element 520, a wavelength conversion layer 540, a light pervious element 560, a light pervious cover layer 570 and a light-reflecting enclosure 580. The same parts with the embodiments of FIG. 1 or/and FIG. 4 can refer to the above-mentioned description, but the different part includes the light pervious cover layer 570 surrounds the side surface of the light-emitting element 520. In an embodiment, the light pervious cover layer 570 covers the side surface of the light-emitting element 520 and contacts a surface of the wavelength conversion layer 540. In addition, a surface of the light pervious cover layer 570 contacts the light-reflecting enclosure 580. In one embodiment, a thickness of the light pervious cover layer 570 is getting thinner from the direction of the wavelength conversion layer 540 to the electrical pads 550a, 550b. Moreover, the light-reflecting enclosure 580 has a slanted inner surface so as to form a space which has a bigger upper portion and a smaller bottom portion to place the light-emitting element 520. Therefore, when the light-emitting element 520 emits a light from the side surface, the light can be reflected from the light-reflecting enclosure 580 to the wavelength conversion layer 540. In another embodiment, thicknesses of the light pervious cover layer 570 and the light-reflecting enclosure 580 above a side surface of the light-emitting element 520 can be substantially the same.

Figure 6:
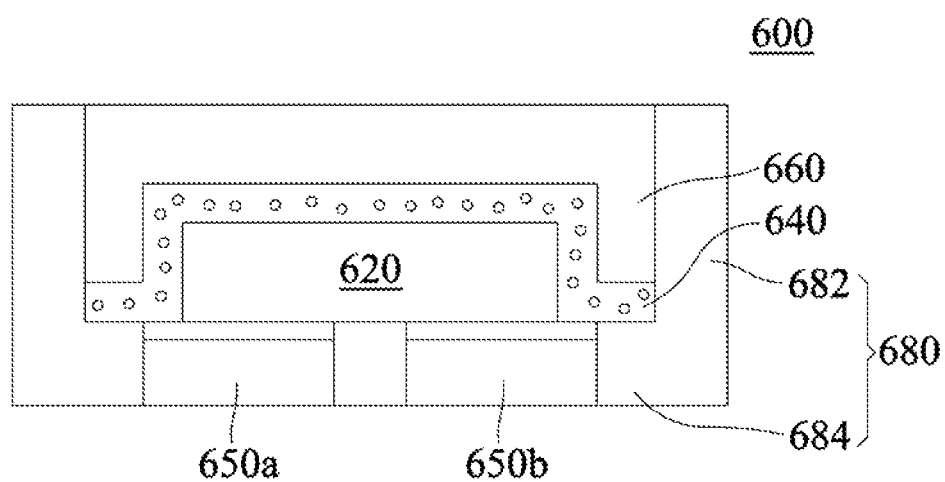
FIG. 6 is a cross-sectional view of a light-emitting device in accordance with another embodiment of the present disclosure.

FIG. 6 is a cross-sectional view of a light-emitting device 600 in accordance with another embodiment of the present disclosure. The light-emitting device 600 includes a light-emitting element 620, a wavelength conversion layer 640, a light pervious element 660, and a light-reflecting enclosure 680. The same part with the embodiments of FIG. 1 or/and FIG. 4 or/and FIG. 5 can refer to the above-mentioned description. As shown in the FIG. 6, in one embodiment, between the light-reflecting enclosure 680 and a side surface of the light-emitting element 620 has a distance. In one embodiment, the light-reflecting enclosure 680 surrounds the light-emitting element 620 to form a recess so as to have a side wall 682 and a bottom portion 684. Furthermore, between the side wall 682 and the side surface of the light-emitting element 620 further includes the wavelength conversion layer 640 and the light pervious element 660. In one embodiment, the wavelength conversion layer 640 covers a top surface of the light-emitting element 620 and the side surface thereof, and extends to a portion on the bottom portion 684 of the light-reflecting enclosure 680. In another embodiment, the light pervious element 660 covers the wavelength conversion layer 640 and fills into the interspace between the wavelength conversion layer 640 and the side wall 682. Because the light pervious element 660 exists between the wavelength conversion layer 640 and the light-reflecting enclosure 680, a portion of light can exit directly from the lateral side of the light-emitting element 620 so as to increase the light extraction. The light-reflecting enclosure 680 in a direction from the wavelength conversion layer 640 to the electrical pads 650a, 650b can be parallel to the side surface of the light-emitting element 620 or include a slanted plane.

It is noted that the foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting element, comprising a first top surface, a first bottom surface, a first side surface between the first top surface and the first bottom surface, and a plurality of electrical pads disposed under the first bottom surface;
a wavelength conversion layer, covering the first top surface, without covering the plurality of electrical pads, and comprising a second bottom surface, a second side surface, and a plurality of wavelength conversion particles with an equivalent particle diameter D50;
a light pervious element, comprising a third top surface and an third side surface, and disposed on the wavelength conversion layer; and
a light-reflecting enclosure surrounding the second side surface, the third side surface, and the plurality of electrical pads,
wherein the D50 is not great than 10 μm, and
wherein the wavelength conversion layer comprises a portion sandwiched between the light-reflecting enclosure and the light pervious element in a normal direction of the first top surface.

2. The light-emitting device according to claim 1, wherein the light pervious element comprises a light pervious adhesive layer and a light pervious substrate.

3. The light-emitting device according to claim 1, wherein the light-reflecting enclosure comprises a fourth top surface coplanar with the third top surface.

4. The light-emitting device according to claim 1, wherein the first side surface is separated from the light-reflecting enclosure by the light pervious element.

5. The light-emitting device according to claim 1, wherein the light-reflecting enclosure comprises a slant plane.

6. The light-emitting device according to claim 1, wherein the wavelength conversion layer comprises a quantum dot luminescent material.

7. The light-emitting device according to claim 1, wherein the wavelength conversion layer comprises an upper section and a bottom section, and a difference between an average of particle sizes of the wavelength conversion particles in the upper section and an average of particle sizes of the wavelength conversion particles in the bottom section is smaller than 10%.

8. The light-emitting device according to claim 1, wherein the wavelength conversion layer comprises an extending portion extending outward the first side surface.

9. The light-emitting device according to claim 1, wherein the wavelength conversion layer comprises a transparent binder.

10. The light-emitting device according to claim 9, wherein a weight percentage of the wavelength conversion particles to the wavelength conversion layer is less than 70%.

11. The light-emitting device according to claim 1, wherein the D50 of the wavelength conversion particles is in a range of 1 μm to 8 μm.

12. The light-emitting device according to claim 1, wherein the wavelength conversion layer has an average thickness, and a ratio of the average thickness to the D50 of the wavelength conversion particles is ranged from 6 to 20.

13. The light-emitting device according to claim 1, wherein the wavelength conversion layer has an average thickness, and a ratio of the average thickness to the D50 of the wavelength conversion particles is ranged from 8 to 15.

14. The light-emitting device according to claim 1, wherein the light-reflecting enclosure comprises a bottom portion arranged under the wavelength conversion layer and the light pervious element.

15. The light-emitting device according to claim 14, wherein the bottom portion has a fourth bottom surface coplanar with a bottom surface of the plurality of electrical pads.

16. The light-emitting device according to claim 1, wherein the light-reflecting enclosure comprises a lower portion arranged between a gap within the plurality of electrical pads.

17. The light-emitting device according to claim 1, wherein the light-reflecting enclosure comprises a portion directly contacting the first bottom surface.

18. The light-emitting device according to claim 1, wherein the plurality of electrical pads does not exceed the second side surface.

19. The light-emitting device according to claim 1, wherein the second side surface directly contacts the light-reflecting enclosure.

20. The light-emitting device according to claim 1, wherein light-reflecting enclosure has a thickness greater than that of the light pervious element in the normal direction of the first top surface.

* * * * *